(12) United States Patent
de Lima et al.

(10) Patent No.: US 8,779,773 B2
(45) Date of Patent: Jul. 15, 2014

(54) THERMOACOUSTIC RF BODY COIL LINER FOR REDUCED ACOUSTIC NOISE IN AN MR SYSTEM

(75) Inventors: Washington de Lima, Florence, SC (US); Timothy John Havens, Florence, SC (US)

(73) Assignee: General Electric Company, Schenectady, NY (US)

( * ) Notice: Subject to any disclaimer, the term of this patent is extended or adjusted under 35 U.S.C. 154(b) by 406 days.

(21) Appl. No.: 13/211,402

(22) Filed: Aug. 17, 2011

(65) Prior Publication Data

US 2013/0043870 A1    Feb. 21, 2013

(51) Int. Cl.
*G01V 3/00* (2006.01)

(52) U.S. Cl.
USPC ............................................. 324/318

(58) Field of Classification Search
CPC ........ G01R 33/34; G01R 33/38; G01R 33/44; G01R 33/385; G01R 33/3403; G01R 33/3854; G01R 33/34007

USPC .................................................. 324/300–322
See application file for complete search history.

(56) References Cited

U.S. PATENT DOCUMENTS

| | | | | |
|---|---|---|---|---|
| 5,841,279 | A * | 11/1998 | Hayashi et al. | 324/318 |
| 7,601,775 | B2 * | 10/2009 | Sugioka et al. | 524/492 |
| 8,362,774 | B2 * | 1/2013 | Katsunuma et al. | 324/318 |
| 8,487,618 | B2 * | 7/2013 | Takamori | 324/318 |
| 2012/0293173 | A1 * | 11/2012 | de Lima et al. | 324/318 |

\* cited by examiner

*Primary Examiner* — Dixomara Vargas
(74) *Attorney, Agent, or Firm* — Ziolkowski Patent Solutions Group, SC

(57) ABSTRACT

A composite RF body coil liner for reducing acoustic noise in an MR System is disclosed. The composite RF body coil liner includes an inner surface layer, an outer surface layer, a fire retardant layer positioned between the inner surface layer and the outer surface layer, and an acoustic barrier positioned between the inner surface layer and the outer surface layer, with the acoustic barrier configured to increase the mechanical damping of the RF body coil so as to reduce RF body coil vibration.

21 Claims, 4 Drawing Sheets

THERMOACOUSTIC RF BODY COIL LINER FOR REDUCED ACOUSTIC NOISE IN AN MR SYSTEM

BACKGROUND OF THE INVENTION

Embodiments of the invention relate generally to an MR system and, more particularly, to a thermoacoustic body coil composite liner to reduce acoustic noise in an MR System.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

In existing MR systems, one problem that is encountered is the loud acoustic noise generated by the system. The noise level generated by the MR system can become uncomfortably loud, both for the patient, or subject, and for the operators. The source of such acoustic noise can be many and varied, however, in general, the noise can be attributed to vibration of an RF coil included in the MR system that surrounds the subject whose purpose is to direct RF energy toward the subject or receive RF energy from the subject, in carrying out the scanning process. The noise/vibration from the RF coil is due to Lorentz forces applied to a gradient coil of the MR system that result from an interaction of a static magnetic field and electrical current, with the Lorentz forces thereby creating vibrations in the gradient coil. Structural borne and airborne noise generated in the gradient coil from the vibrations reach the RF body coil, which in turn vibrates and consequently radiates acoustic noise into the patient bore of the MR system.

The acoustic noise from the RF coil is difficult to control due to its close proximity to the patient, or subject, bore. There have been attempts at reducing the acoustic noise from the RF coil. Such attempts have included breaking up the RF conductor, where possible, to reduce eddy currents and constrained layer damping to reduce the RF support form vibration. These attempts, however, have not been able to eliminate all of the acoustic noise from the RF coil.

It is also recognized that it is desirable to shield or insulate patients from heat that might be generated by the MR system during an imaging process. For example, heat might be created from electrical and/or thermal failure of electrical components of an MR system, such as capacitors, inductors, diodes, high power cables, and the like.

Therefore, it would therefore be desirable to have an RF coil having a reduced acoustic output by providing acoustic isolation between the RF conductors and the patient. It would also be desirable to provide a mechanism for shielding or insulating patients from heat that might be generated by the MR system during an imaging process.

BRIEF DESCRIPTION OF THE INVENTION

In accordance with one aspect of the invention, a composite RF body coil liner is provided for an RF body coil of an MR scanning apparatus. The composite RF body coil liner includes an inner surface layer, an outer surface layer, a fire retardant layer positioned between the inner surface layer and the outer surface layer, and an acoustic barrier positioned between the inner surface layer and the outer surface layer, with the acoustic barrier configured to increase the mechanical damping of the RF body coil so as to reduce RF body coil vibration.

In accordance with another aspect of the invention, a method of lining an RF body coil for reducing acoustic noise includes providing an RF support form of a generally cylindrical shape having an interior surface facing a patient bore and an exterior surface and attaching a multi-layer body coil liner to the interior surface of the RF support form. The multi-layer body coil liner includes an inner layer, an outer layer, a fire retardant layer positioned between the inner layer and the outer layer, and an acoustic barrier positioned between the inner layer and the outer layer, the acoustic barrier configured to increase the mechanical damping of the RF body coil so as to reduce RF body coil vibration and enhance noise reduction performance of the multi-layer body coil liner.

In accordance with yet another aspect of the invention, a magnetic resonance imaging (MRI) system includes an RF transceiver system to acquire MR images and a gradient coil assembly positioned about a bore of a magnet to impress a polarizing magnetic field, with the gradient coil assembly including a polarizing magnet and RF body coil having an RF support form. The MRI system also includes a multi-layer body coil liner attached to an interior surface of the RF support form facing the bore, with the composite body coil liner further including a fire retardant elastic solid cover having an inner layer facing the bore and an outer layer attached to the RF support form, a fire retardant foam positioned between the inner and outer layers of the fire retardant elastic solid cover, and a first acoustic barrier layer positioned between the inner and outer layers of the fire retardant elastic solid cover, the first acoustic barrier layer configured to increase the mechanical damping of the RF body coil so as to reduce RF body coil vibration.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
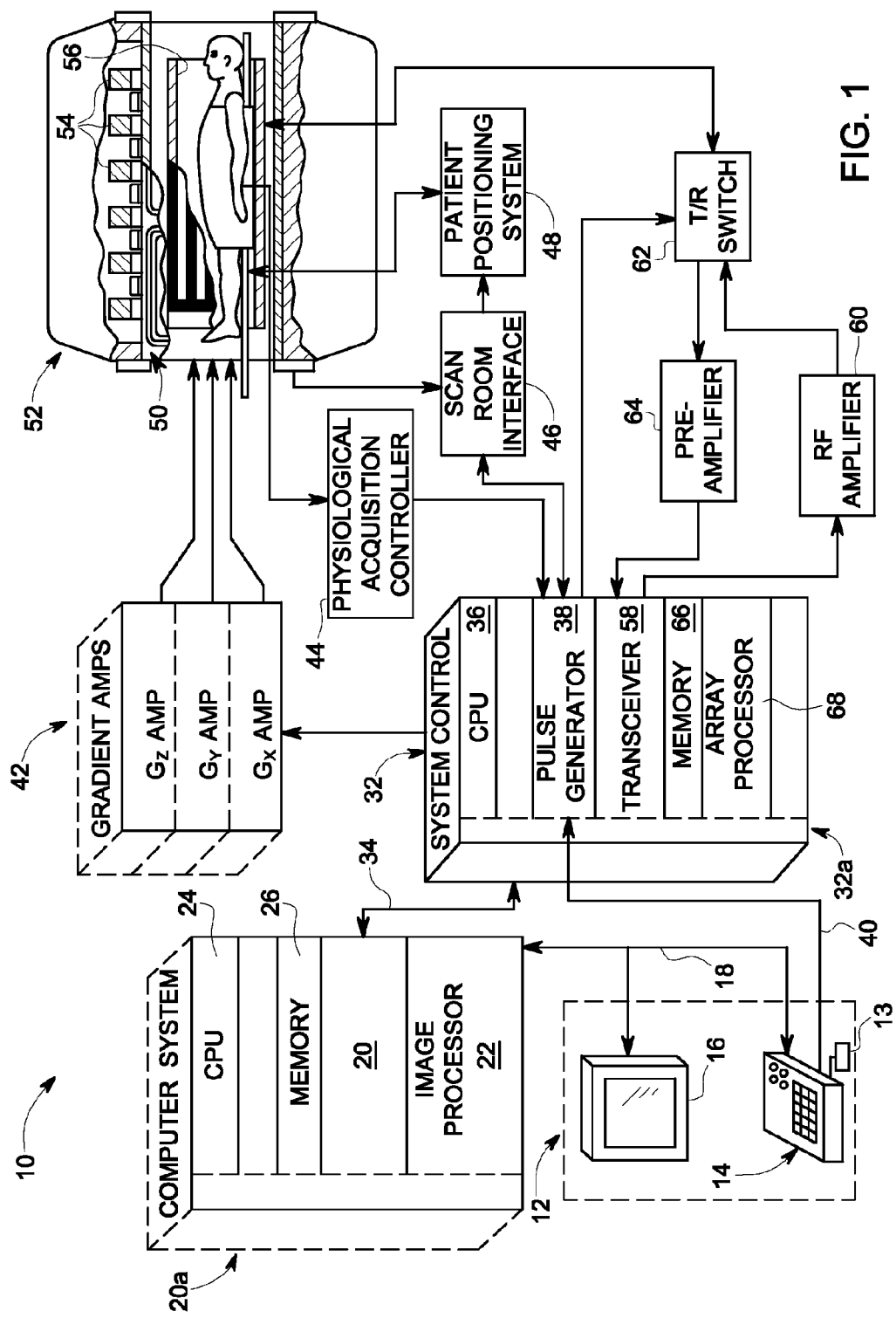
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
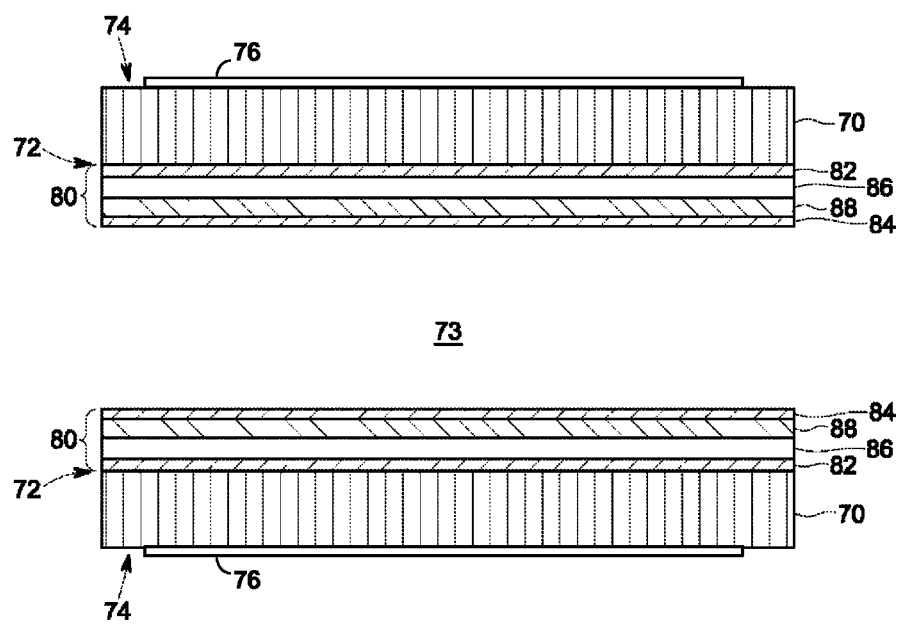
FIG. 2 is a side cross-sectional view of an RF body coil for use in the MR imaging system of FIG. 1 according to an embodiment of the invention.
Figure 3:
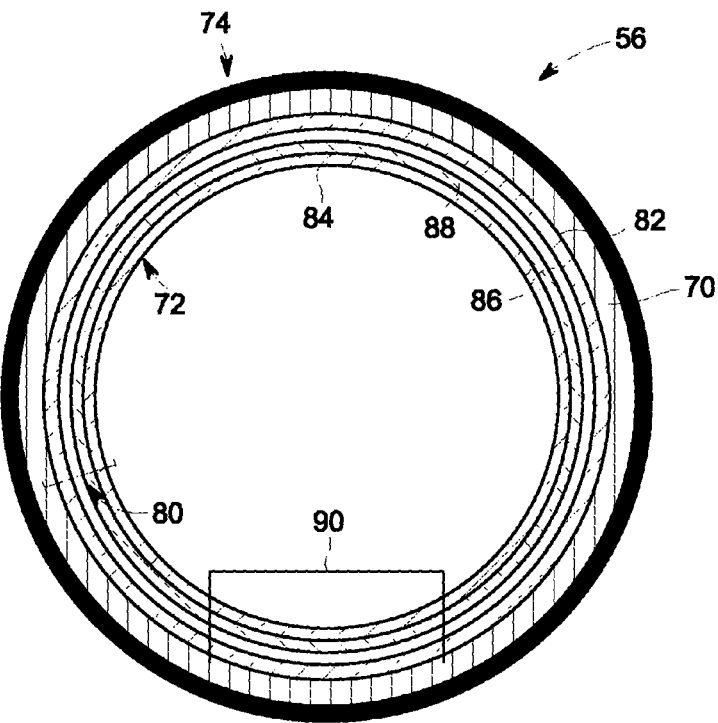
FIG. 3 is a front cross-sectional view of the RF body coil of FIG. 2 according to an embodiment of the invention.

Referring now to FIGS. 2 and 3, cross-sectional side and front views of an RF body coil and a composite body coil liner constructed in accordance with an embodiment of the invention are shown. The RF body coil 56 includes an RF support form 70 that is cylindrical, with the RF support form 70 having an interior surface 72 facing a patient bore 73 and an exterior surface 74. The RF support form 70 is normally formed of a composite or fiberglass material and surrounds the patient. Positioned about the RF support form 70 is a plurality of RF legs or antennas that collectively form an RF conductor 76 that functions to generate or receive the RF energy used in the scanning process.

As shown in FIGS. 2 and 3, according to an embodiment of the invention, a composite body coil liner 80 is affixed to the interior surface 72 of RF support form 70 of RF body coil in order to add mass to the RF body coil 56, reduce the airborne and structural borne noise radiated by the RF body coil 56, and provide increased protection to a subject/patient being imaged from heat that might be created from electrical and/or thermal failure of electrical components of MR system 10, such as capacitors, inductors, diodes, high power cables, and the like.

As shown in FIGS. 2 and 3, composite body coil liner 80 is a multi-layered structure that includes a plurality of layers therein in a stacked arrangement. The layers of composite body coil liner 80 are formed varied materials that serve to enhance both the noise reduction performance of the liner 80 and the heat and fire protection performance of the liner. The composite body coil liner 80 includes an outer surface layer 82 and an inner surface layer 84, with each of the layers 82, 84 being formed of a fire retardant elastic solid material. The inner and outer surface layers 82, 84 are constructed as durable layers that provide protection to composite body coil liner 80, while also functioning to provide increased fire protection and insulation to a subject/patient from heat generated by MR system 10. A fire retardant layer 86 is provided between inner and outer surface layers 82, 84 of composite body coil liner 80 that is formed from fire retardant foam. The fire retardant layer 86 is configured to provide thermal insulation and protection to a patient positioned in bore 73. According to an exemplary embodiment, the layer 86 of fire retardant foam is constructed as a heterogeneous blanket that is formed of a poroelastic material with small embedded masses therein. An acoustic barrier layer 88 is also provided between the inner and outer surface layers 82, 84 of composite body coil liner 80. The acoustic barrier layer 88 is formed from a sound and vibration dampening material configured to enhance the noise reduction performance of the liner. According to an exemplary embodiment, acoustic barrier layer 88 is made of rubber, although it is recognized that other suitable materials could also be employed, such as a fiber reinforced plastic, a viscoelastic foam, or a viscoelastic polymer that exhibits exemplary noise reduction properties.

As shown in FIG. 3, according to one embodiment of the invention, composite body coil liner 80 is configured as a non-removable liner. The composite body coil liner 80 thus has a cylindrical shape that conforms to interior surface 72 of RF support form 70. The cylindrical composite body coil liner 80 covers the entirety of the interior surface 72 of RF support form 70. As shown in FIG. 3, a bridge 90 of MR system 10 (which is a fixed, patient load-carrying structure over which a cradle mechanism (not shown) carrying the patient is translated in performing the scanning procedure) is formed over the composite body coil liner 80. As bridge 90 covers composite body coil liner 80, it is deemed to be a non-removable liner.

Figure 4:
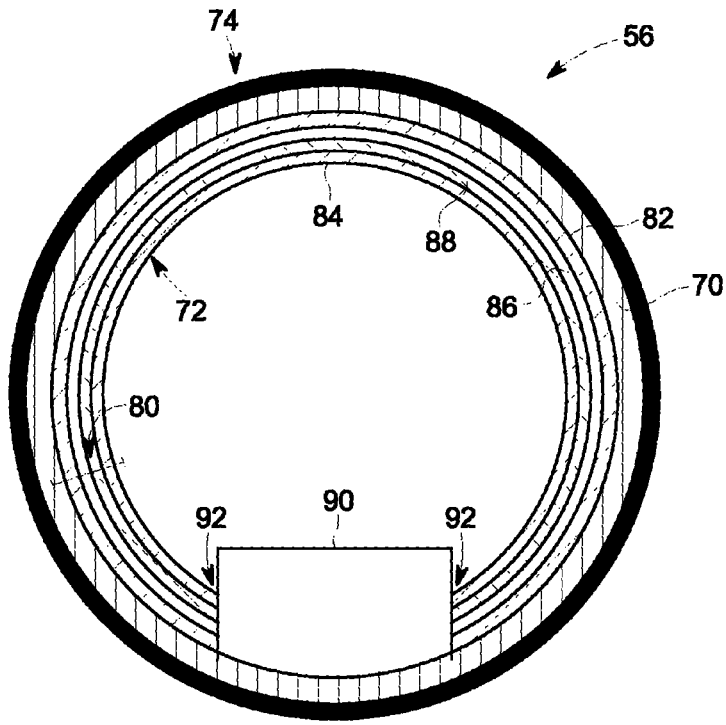
FIG. 4 is a front cross-sectional view of the RF body coil of FIG. 2 according to another embodiment of the invention.

Referring now to FIG. 4, a cross-sectional front view of an RF boy coil and composite body coil liner is shown constructed in accordance with another embodiment of the invention. As shown in FIG. 4, the composite body coil liner 80 is configured as a removable liner. The composite body coil liner 80 thus has an arc shape that provides for greater ease in insertion and removal of the liner 80 from RF support form 70. The arc-shaped composite body coil liner 80 includes a gap 92 formed therein formed adjacent bridge 90, such that the bridge 90 does not cover any portion of composite body coil liner 80. As bridge 90 does not cover any portion of composite body coil liner 80, it is deemed to be a removable liner. According to one embodiment of the invention, arc-shaped composite body coil liner 80 extends beyond the ends of the RF body coil.

Figure 5:
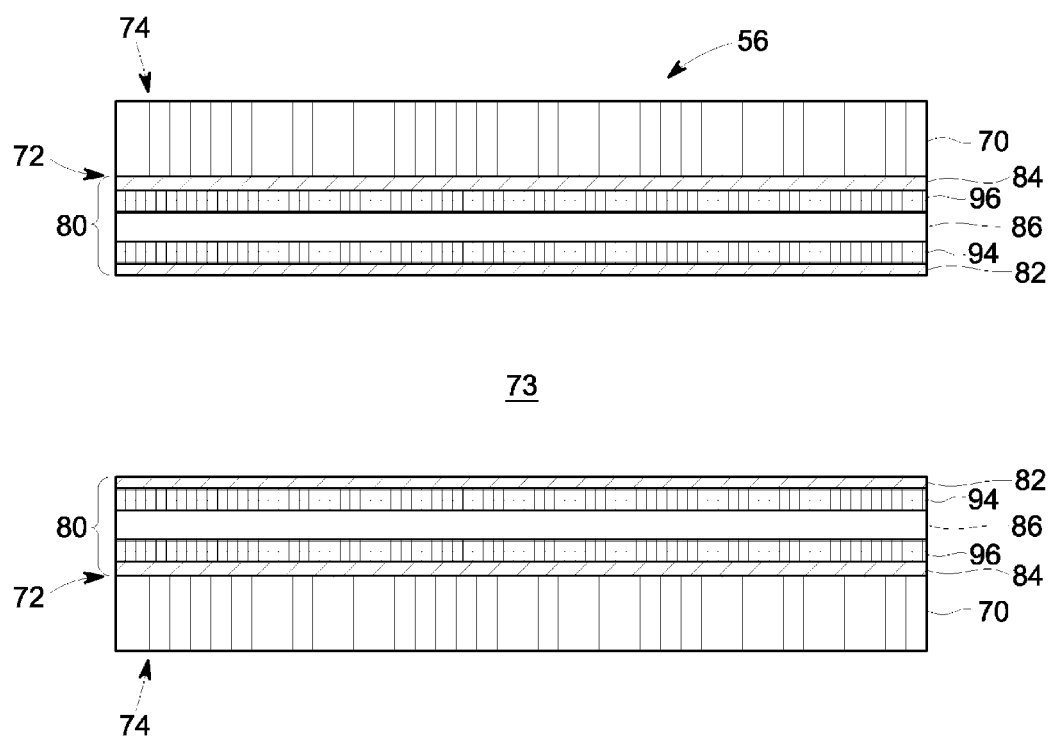
FIG. 5 is a front cross-sectional view of an RF body coil according to another embodiment of the invention.

Referring now to FIG. 5, a cross-sectional side view of an RF body coil and composite body coil liner is shown constructed in accordance with another embodiment of the invention. As shown in FIG. 5, a composite body coil liner 80 is provided on the interior surface 72 of RF support form 70 of the RF body coil 56 that includes multiple acoustic barrier layers 94, 96. That is, a first acoustic barrier layer 94 is positioned between the inner surface layer 82 and the fire retardant layer 86, and a second acoustic barrier layer 96 is positioned between the outer surface layer 84 and the fire retardant layer 86. According to one embodiment, both the first and second acoustic barrier layers 94, 96 are made of rubber. Beneficially, the pair of acoustic barrier layers 94, 96 provided in the composite body coil liner 80 of FIG. 5 serves to further optimize the acoustic performance of the composite body coil liner 80. Furthermore, in addition to varying the number of layers of acoustic barrier layers in composite body coil liner 80, it is also recognized that the thickness of each acoustic barrier layer can also be controlled/varied so as to optimize the noise reduction performance of composite body coil liner 80 at a desired level.

Beneficially, embodiments of the present invention thus provide an RF coil having a reduced acoustic output. Additionally, embodiments of the present invention also provide for increased shielding and insulation of a patient from heat that might be generated by the MR system during an imaging process, such as heat that might be created from electrical and/or thermal failure of electrical components of an MR system, such as capacitors, inductors, diodes, high power cables, and the like.

Therefore, according to one embodiment of the invention, a composite RF body coil liner is provided for positioning on an RF body coil of an MR scanning apparatus. The composite RF body coil includes an inner surface layer, an outer surface layer, a fire retardant layer positioned between the inner surface layer and the outer surface layer, and an acoustic barrier positioned between the inner surface layer and the outer surface layer, with the acoustic barrier configured to increase the mechanical damping of the RF body coil so as to reduce RF body coil vibration.

According to another embodiment of the invention, a method of lining an RF body coil for reducing acoustic noise includes providing an RF support form of a generally cylindrical shape having an interior surface facing a patient bore and an exterior surface and attaching a multi-layer body coil liner to the interior surface of the RF support form. The multi-layer body coil liner includes an inner layer, an outer layer, a fire retardant layer positioned between the inner layer and the outer layer, and an acoustic barrier positioned between the inner layer and the outer layer, the acoustic barrier configured to increase the mechanical damping of the RF body coil so as to reduce RF body coil vibration and enhance noise reduction performance of the multi-layer body coil liner.

According to yet another embodiment of the invention, a magnetic resonance imaging (MRI) system includes an RF transceiver system to acquire MR images and a gradient coil assembly positioned about a bore of a magnet to impress a polarizing magnetic field, with the gradient coil assembly including a polarizing magnet and RF body coil having an RF support form. The MRI system also includes a multi-layer body coil liner attached to an interior surface of the RF support form facing the bore, with the composite body coil liner further including a fire retardant elastic solid cover having an inner layer facing the bore and an outer layer attached to the RF support form, a fire retardant foam positioned between the inner and outer layers of the fire retardant elastic solid cover, and a first acoustic barrier layer positioned between the inner and outer layers of the fire retardant elastic solid cover, the first acoustic barrier layer configured to increase the mechanical damping of the RF body coil so as to reduce RF body coil vibration.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A composite RF body coil liner for lining an interior surface of an RF body coil of an MR scanning apparatus so as to be positioned between the RF body coil and a patient, the composite RF body coil liner comprising:
   an inner surface layer;
   an outer surface layer;
   a fire retardant layer positioned between the inner surface layer and the outer surface layer; and
   an acoustic barrier positioned between the inner surface layer and the outer surface layer, the acoustic barrier configured to increase the mechanical damping of the RF body coil and reduce RF body coil vibration.

2. The composite RF body coil liner of claim 1 wherein each of the inner surface layer and the outer surface layer comprises a fire retardant elastic solid material.

3. The composite RF body coil liner of claim 1 wherein the fire retardant layer comprises a fire retardant foam further configured to provide thermal insulation about the patient bore.

4. The composite RF body coil liner of claim 3 wherein the fire retardant foam comprises a heterogeneous blanket having a poroelastic material with masses embedded therein.

5. The composite RF body coil liner of claim 1 wherein the acoustic barrier comprises a layer of rubber material.

6. The composite RF body coil liner of claim 1 wherein the RF composite body coil liner comprises a cylindrical shaped non-removable liner.

7. The composite RF body coil liner of claim 1 wherein the composite RF body coil liner comprises an arc shaped removable liner, the arc shaped removable liner including a gap therein configured to receive and be positioned about a bridge of the MR scanning apparatus.

8. The composite RF body coil liner of claim 7 wherein the arc shaped removable liner extends beyond the ends of the RF body coil.

9. The composite RF body coil liner of claim 1 further comprising an additional acoustic barrier positioned between the inner surface layer and the outer surface layer and being separated from the other acoustic barrier by the fire retardant layer, the additional acoustic barrier configured to increase the mechanical damping of the RF body coil so as to reduce RF body coil vibration.

10. The composite RF body coil liner of claim 1 wherein the acoustic barrier has a thickness configured to optimize an acoustic performance of the composite body coil liner.

11. The composite RF body coil liner of claim 1 wherein the composite RF body coil liner is configured to be positioned on an interior surface of the RF body coil.

12. A method of lining an RF body coil for reducing acoustic noise comprising:
providing an RF body coil configured to generate or receive RF energy used in a scanning process, the RF body coil comprising an RF support form of a generally cylindrical shape having an interior surface facing a patient bore and an exterior surface; and
attaching a multi-layer body coil liner to the interior surface of the RF support form, wherein the multi-layer body coil liner comprises:
an inner layer;
an outer layer;
a fire retardant layer positioned between the inner layer and the outer layer; and
an acoustic barrier positioned between the inner layer and the outer layer, the acoustic barrier configured to increase the mechanical damping of the RF body coil to reduce RF body coil vibration and enhance noise reduction performance of the multi-layer body coil liner.

13. The method of claim 12 wherein each of the inner layer and the outer layer comprises a fire retardant elastic solid material.

14. The method of claim 12 wherein the fire retardant layer comprises a fire retardant foam configured to provide thermal insulation and fire protection about the patient bore.

15. The method of claim 14 wherein the fire retardant foam comprises a heterogeneous blanket having a poroelastic material with masses embedded therein.

16. The method of claim 12 wherein attaching the multi-layer body coil liner comprises one of fixedly attaching a cylindrical shaped multi-layer body coil liner to the interior surface of the RF support form and removably attaching an arc shaped multi-layer body coil liner to the interior surface of the RF support form.

17. A magnetic resonance imaging (MRI) system comprising:
an RF transceiver system to acquire MR images;
a gradient coil assembly positioned about a bore of a magnet to impress a polarizing magnetic field, wherein the gradient coil assembly includes a polarizing magnet and RF body coil, with the RF body coil including an RF support form having an RF conductor positioned on an exterior surface of the RF support form; and
a multi-layer body coil liner attached to an interior surface of the RF support form facing the bore, the composite body coil liner comprising:
a fire retardant elastic solid cover, the fire retardant elastic solid cover comprising an inner layer facing the bore and an outer layer attached to the RF support form;
a fire retardant foam positioned between the inner and outer layers of the fire retardant elastic solid cover; and
a first acoustic barrier layer positioned between the inner and outer layers of the fire retardant elastic solid cover, the first acoustic barrier layer configured to increase the mechanical damping of the RF body coil and reduce RF body coil vibration.

18. The MRI system of claim 17 wherein the fire retardant foam comprises a heterogeneous blanket having a poroelastic material with masses embedded therein.

19. The MRI system of claim 17 wherein the acoustic barrier layer comprises a layer of rubber material.

20. The MRI system of claim 17 wherein the multi-layer body coil liner further comprises a second acoustic barrier layer positioned between the inner and outer layers of the fire retardant elastic solid cover and being separated from the first acoustic barrier layer by the fire retardant foam, the second acoustic barrier layer configured to increase the mechanical damping of the RF body coil so as to reduce RF body coil vibration.

21. The MRI system of claim 17 wherein the acoustic barrier layer has a thickness configured to optimize an acoustic performance of the multi-layer body coil liner.

* * * * *